United States Patent
Pan et al.

(10) Patent No.: US 11,131,694 B1
(45) Date of Patent: Sep. 28, 2021

(54) SYSTEM AND METHOD FOR MONITORING CURRENT

(71) Applicant: HONGFUJIN PRECISION ELECTRONICS(TIANJIN)CO., LTD., Tianjin (CN)

(72) Inventors: Sheng-Chung Pan, New Taipei (TW); Chi-Pu Hsieh, Neihu (TW)

(73) Assignee: HONGFUJIN PRECISION ELECTRONICS(TIANJIN)CO., LTD., Tianjin (CN)

( * ) Notice: Subject to any disclaimer, the term of this patent is extended or adjusted under 35 U.S.C. 154(b) by 0 days.

(21) Appl. No.: 16/899,378

(22) Filed: Jun. 11, 2020

(30) Foreign Application Priority Data

Mar. 24, 2020 (CN) .......................... 202010215266.3

(51) Int. Cl.
*G01R 19/00* (2006.01)
*G01R 31/08* (2020.01)
*G01R 31/52* (2020.01)

(52) U.S. Cl.
CPC ....... *G01R 19/0092* (2013.01); *G01R 31/086* (2013.01); *G01R 31/088* (2013.01); *G01R 31/52* (2020.01)

(58) Field of Classification Search
CPC .............. G01R 19/0092; G01R 31/088; G01R 31/086; G01R 31/52
USPC ....................................................... 324/76.11
See application file for complete search history.

(56) References Cited

U.S. PATENT DOCUMENTS

2015/0212124 A1* 7/2015 Kashiwagi ........... G01R 19/165
324/103 R
2019/0245458 A1* 8/2019 Wang .................... H02M 3/335

FOREIGN PATENT DOCUMENTS

TW M560144 U 5/2018

* cited by examiner

*Primary Examiner* — Farhana A Hoque
(74) *Attorney, Agent, or Firm* — ScienBiziP, P.C.

(57) ABSTRACT

A system for measuring throughflow of current includes a plurality of monitoring units and an electronic device. Each of the plurality of monitoring units is positioned in a switchboard for monitoring the current flowing through the switchboard and outputting a current signal. The electronic device is electronically connected to the plurality of monitoring units. The electronic device receives the current signal transmitted by the plurality of monitoring units, performs analysis and filtering to isolate and display information as to three-phase current being consumed through the plurality of switchboards.

11 Claims, 3 Drawing Sheets

SYSTEM AND METHOD FOR MONITORING CURRENT

FIELD

The subject matter herein generally relates to electrical monitoring.

BACKGROUND

Generally, a current meter is connected to a switchboard in an equipment room to display information as to current flowing through the switchboard. Then, if the current flowing through the switchboard is overloaded, this can be determined by the current information displayed by the current meter. If it is overloaded, a circuit breaker of the switchboard will be manually controlled to be powered off, thereby reducing the current flowing through the switchboard. However, the above manner requires technicians permanently in the equipment room, and a labor cost is high.

Therefore, there is room for improvement within the art.

BRIEF DESCRIPTION OF THE DRAWINGS

Many aspects of the disclosure can be better understood with reference to the figure. The components in the figures are not necessarily drawn to scale, the emphasis instead being placed upon clearly illustrating the principles of the disclosure.

DETAILED DESCRIPTION

Figure 1:
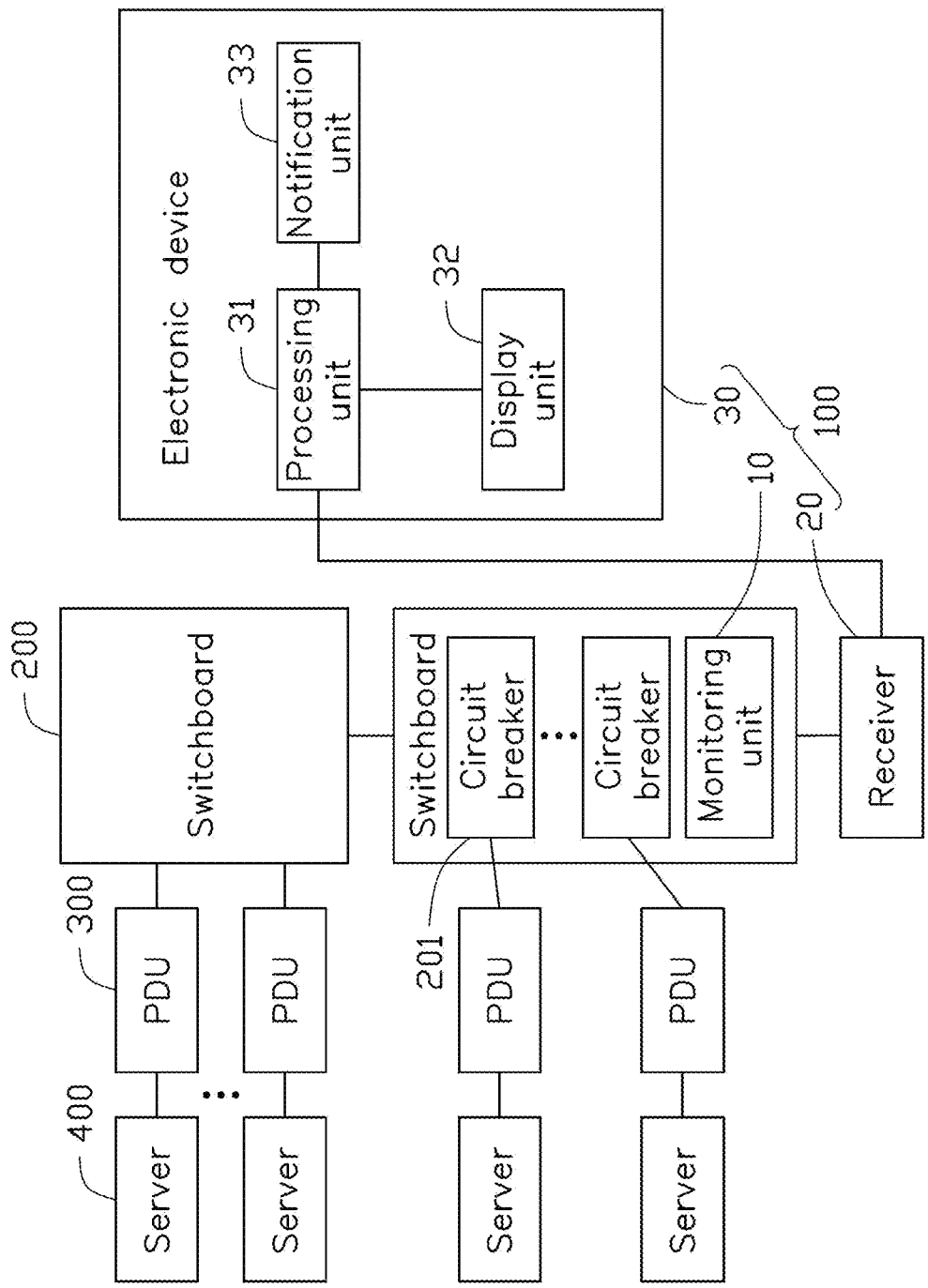
FIG. 1 is a block diagram of a system for monitoring current according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

FIG. 1 illustrates a system 100 for monitoring the amount of current flowing through each of a plurality of switchboards 200. The system 100 includes a plurality of monitoring units 10, a receiver 20, and an electronic device 30. The number of monitoring units 10 is the same as the number of switchboards 200. Each of the plurality of monitoring units 10 is positioned in a switchboard 200 for monitoring the current flowing through the switchboard 200 and outputting a signal as to current. The receiver 20 is electrically connected to the plurality of monitoring units 10 and the electronic device 30. The receiver 20 transmits the current signals output by the plurality of monitoring units 10 to the electronic device 30. The electronic device 30 analyzes and filters out information as to three-phase current flowing through the switchboard 200. In this way, whether the current flowing through the switchboard 200 is overloaded or the consumption is excessive can be determined according to the three-phase current information.

In this embodiment, each of the plurality of switchboards 200 includes a plurality of circuit breakers 201. The circuit breakers 201 are all positioned in the switchboard 200. In this embodiment, each circuit breaker 201 may be a single pole single throw switch. Each circuit breaker 201 can be electrically connected to a server 400 through a power distribution unit (PDU) 300. When the circuit breaker 201 is closed, the switchboard 200 distributes current to the server 400 through the closed circuit breaker 201 and the power distribution unit 300, so that the server 400 works normally. When the current flowing through the switchboard 200 is too high, for example, exceeding a range that the switchboard 200 can safely bear, this indicates that the current flowing through the switchboard 200 is overloaded. In the prior art, when the current flowing through the switchboard 200 is overloaded, all the circuit breakers 201 in the switchboard 200 will be powered off, which causes shutdown of all servers 400, or reduced function. As such, in this embodiment, at least one of all circuit breakers 201 can be powered off to prevent the current flowing through the switchboard 200 from being too high and causing damage to the switchboard 200, thereby avoiding any effect on the normal operation of other servers 400.

In this embodiment, the plurality of the switchboards 200 can be connected in series through a serial communication protocol and then electrically connected to the receiver 20. The monitoring unit 10 in each of the plurality of switchboards 200 transmits the signal as to current carrying a number of the switchboard 200 to the electronic device 30 through the receiver 20. In this embodiment, the receiver 20 may be a serial communication protocol converter.

The electronic device 30 includes a processing unit 31 and a display unit 32. The processing unit 31 is electrically connected to the receiver 20. The processing unit 31 receives the current signal transmitted by the receiver 20, performs analysis and filtering, and then outputs the three-phase current information to the display unit 32. In one embodiment, the processing unit 31 may be a central processing unit (CPU).

The display unit 32 is electrically connected to the processing unit 31. The display unit 32 receives and displays the three-phase current information output by the processing unit 31.

Figure 2:
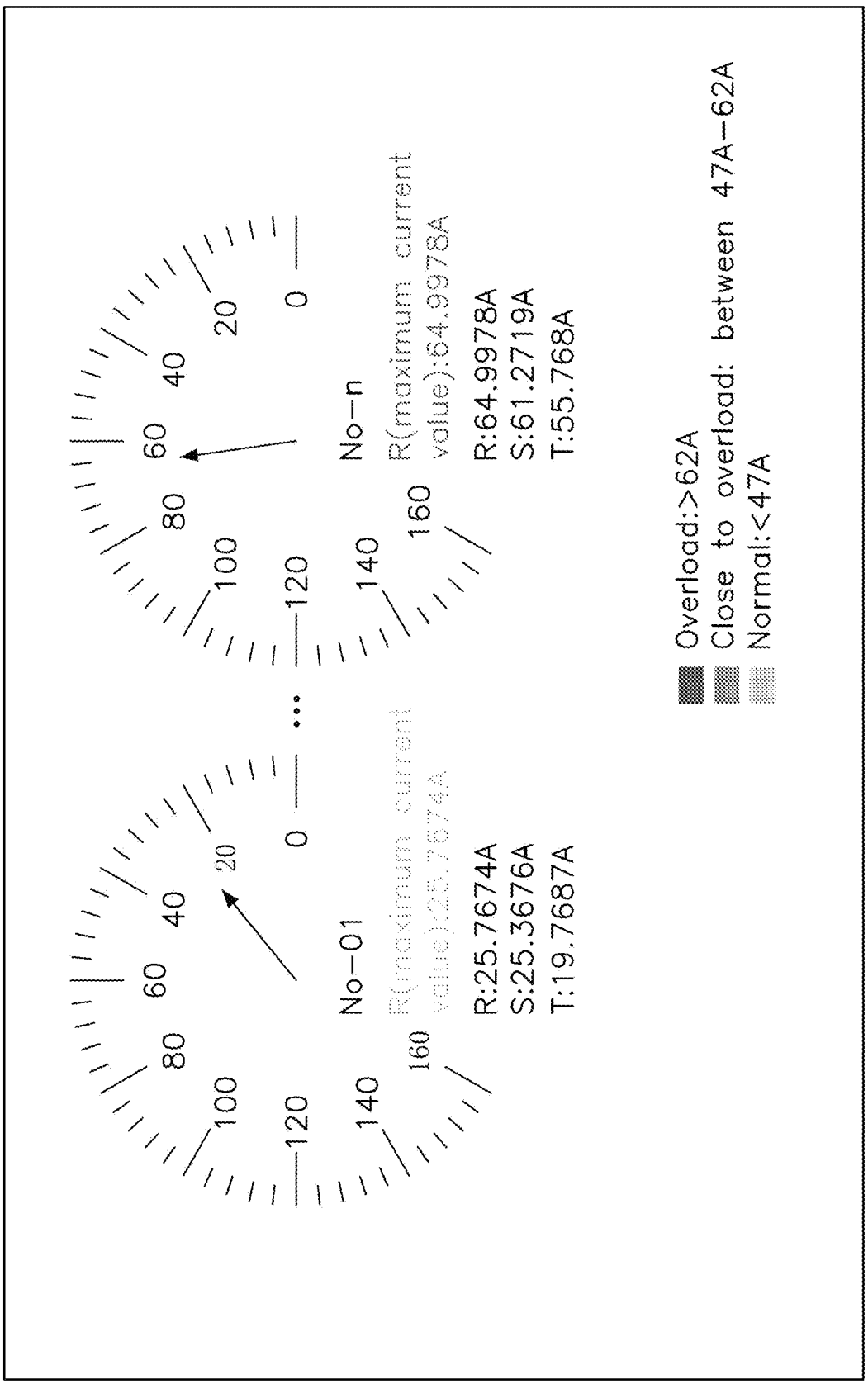
FIG. 2 is a schematic view of three-phase current information displayed by an electronic device of the current monitoring system shown in FIG. 1.

As illustrated in FIG. 2, in this embodiment, the three-phase current information at least includes three-phase current values. In this embodiment, the three-phase current is three separate alternating currents, with equal amplitudes and equal frequencies, but with a phase difference of 120° between phases. In this embodiment, the three-phase current values are defined as a first phase current value R, a second phase current value S, and a third phase current value T, respectively. Therefore, the three-phase current information displayed by the display unit 32 includes the current values of an R phase, an S phase, and a T phase. The display unit 32 also separately displays a maximum current value of the R phase, S phase, and T phase. In this way, whether the three-phase current value is overloaded can be determined by the separately displayed maximum current value.

For example, when the maximum current value of the three-phase current value is within a first preset range, for example, not more than 47 amperes (A), the processing unit 31 determines that the current flowing through the switchboard 200 is within a normal range and sends a first control signal to the display unit 32 to control the maximum current value to be displayed with a first color.

When the maximum current value of the three-phase current value is within a second preset range, for example, between 47 A and 62 A, that is, greater than 47 A but less than 62 A, the processing unit 31 determines that the current flowing through the switchboard 200 is close to overload range and sends a second control signal to the display unit 32 to control the maximum current value to be displayed with a second color.

When the maximum current value of the three-phase current value is greater than the maximum value of the second preset range, for example, equal to or greater than 62 A, the processing unit 31 determines that the current flowing through the switchboard 200 is in an overload state and sends a three control signal to the display unit 32 to control the maximum current value to be displayed with a third color.

In this embodiment, the maximum value of the second preset range value may be, but is not limited to, 85% of the maximum current value that can flow through the switchboard 200.

In this way, whether the current flowing through the switchboard 200 is overloaded can be determined according to the maximum current value. For example, when the maximum current value is displayed with the third color, the current flowing through the switchboard 200 is deemed to be overloaded. When the maximum current value is displayed with the first color or the second color, the current flowing through the switchboard 200 is deemed to be not overloaded.

In one embodiment, the first color may be green, the second color may be yellow, and the third color may be red. Of course, in other embodiments, the first color, the second color, and the third color can be set or adjusted according to specific requirements.

In this embodiment, the three-phase current information further includes the number of switchboards 200. For example, the number of switchboards 200 may be NO-01, . . . , NO-n. As illustrated in FIG. 2, in this embodiment, for example, the maximum current value of the switchboard 200 with the number of NO-01 is 25.7674 A, and the maximum current value is in the first preset range, that is, less than 47 amperes (A). In this way, the maximum current value displays the first color, and it can be determined that the current flowing through the switchboard 200 numbered NO-01 is not overloaded.

In this embodiment, the display unit 32 displays the three-phase current information of the plurality of switchboards 200 at the same time. In this way, the three-phase current information of the plurality of switchboards 200 can be directly monitored through the display unit 32, so as to quickly observe whether the current of a corresponding switchboard 200 is overloaded.

For example, in this embodiment, when the maximum current value displayed by the display unit 32 displays a third color, a position of the overloaded switchboard 200 can be determined according to the displayed third color and an identity number of the switchboard 200, and then it is convenient to control some circuit breakers 201 in the overloaded switchboard 200 to be powered off. For example, the maximum current value of the switchboard 200 numbered NO-n in FIG. 2 is 64.9978 A, and the maximum current value is greater than the maximum value in the second preset range, that is, greater than 62 A. In this way, the maximum current value displays the third color and it can be determined that the current flowing through the switchboard 200 numbered NO-n is overloaded.

In this embodiment, the electronic device 30 further includes a notification unit 33. The notification unit 33 is electrically connected to the processing unit 31. When the processing unit 31 determines that the maximum current value of the switchboard 200 is greater than the maximum value of the second preset range, that is, the current flowing through the switchboard 200 is overloaded, the notification unit 33 receives a notification signal and the three-phase current information of the overloaded switchboard 200 which is output by the processing unit 31.

When the notification unit 33 receives the notification signal and the information as to three-phase current, the notification unit 33 sends the received information as to three-phase current to relevant personnel to notify such personnel that the switchboard 200 is overloaded.

In this embodiment, the display unit 32 may also be refreshed at intervals, so as to display a latest three-phase current information in or close to real-time. In this embodiment, the interval may be set to 10 minutes or less. In another embodiment, the display unit 32 may also display the time of the latest refresh.

In this embodiment, the processing unit 31 can also store the three-phase current information through a storage unit, so as to facilitate measuring and analyzing the current data of each switchboard 200. For example, a power consumption of the switchboard 200 per hour, per daily current data, per monthly power consumption, and per annual power consumption can be analyzed according to the three-phase current information stored in the storage unit.

Figure 3:
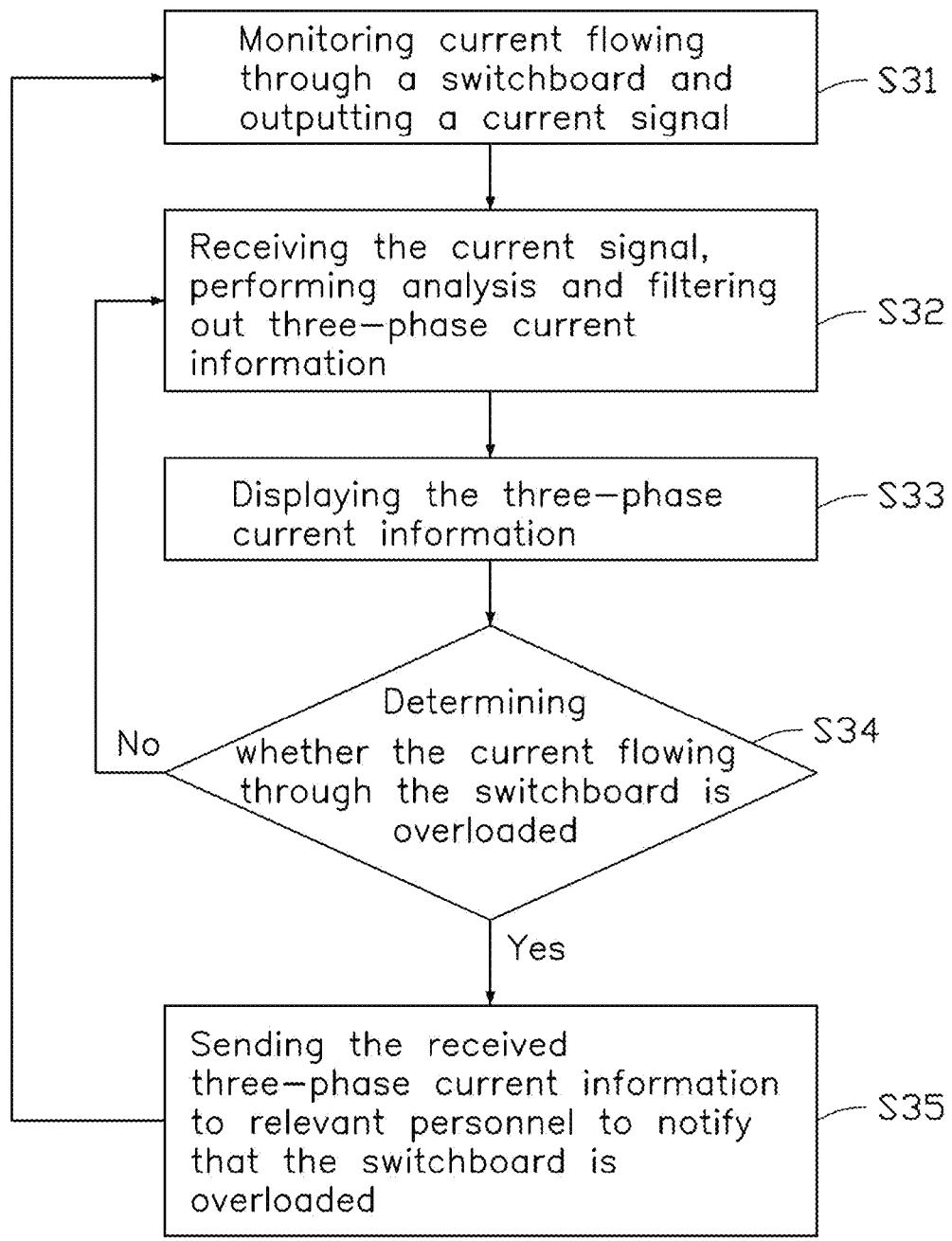
FIG. 3 is a flowchart of a method for monitoring current according to an embodiment of the present disclosure.

In this embodiment, a current monitoring method is also provided. The method is configured to determine whether the current flowing through the switchboard 200 is overloaded through being excessive. The method is provided by way of example, as there are a variety of ways to carry out the method. Each block shown in FIG. 3 represents one or more processes, methods, or subroutines which are carried out in the example method. Furthermore, the order of blocks is illustrative only and additional blocks can be added or fewer blocks may be utilized without departing from the scope of this disclosure.

At block S31, the monitoring unit 10 monitors the current flowing through the switchboard 200 and outputs a current signal.

In this embodiment, the monitoring unit 10 is positioned in the switchboard 200.

In this embodiment, the system 100 can monitor the current flowing through a plurality of the switchboards 200. That is, there is a plurality of switchboards 200. The plurality of the switchboards 200 can be connected in series through a serial communication protocol and then electrically connected to the receiver 20. The monitoring unit 10 in each of the plurality of switchboards 200 transmits the current signal carrying an identity number of the switchboard 200 to the electronic device 30 through the receiver 20. In this embodiment, the receiver 20 may be a serial communication protocol converter.

At block S32, the electronic device 30 receives the current signal transmitted by the receiver 20, performs analysis, and filtering out the three-phase current information.

In this embodiment, the electronic device 30 includes a processing unit 31 and a display unit 32. The processing unit 31 is electrically connected to the receiver 20. The processing unit 31 receives the current signal transmitted by the receiver 20, performs analysis and filtering, and then outputs the three-phase current information to the display unit 32. In one embodiment, the processing unit 31 may be a central processing unit (CPU).

At block S33, the display unit 32 receives and displays the three-phase current information output by the processing unit 31.

In this embodiment, the three-phase current information at least includes three-phase current values and the number of switchboards 200. The three-phase current is as already described, the first to third phases being phase R, phase S, and phase T. Therefore, the three-phase current information displayed by the display unit 32 includes the current values of R, S, and T phases. The display unit 32 also separately displays a maximum current value of each of the R, S, and T phases.

At block S34, the processing unit 31 determines whether the current flowing through the switchboard 200 is overloaded.

In this embodiment, whether the three-phase current value is overloaded can be determined by the separately displayed maximum current value and a control signal is an output to the display unit 32.

For example, when the maximum current value of the three-phase current value is within the first preset range, for example, not more than 47 amperes (A), the processing unit 31 determines that the current flowing through the switchboard 200 is within a normal range and sends a first control signal to the display unit 32 to control the maximum current value to be displayed with a first color.

When the maximum current value of the three-phase current value is within a second preset range, for example, between 47 A and 62 A, that is, equal to or greater than 47 A and but less than 62 A, the processing unit 31 determines that the current flowing through the switchboard 200 is close to an overload range and sends a second control signal to the display unit 32 to control the maximum current value to be displayed with a second color.

When the maximum current value of the three-phase current value is greater than the maximum value of the second preset range, for example, greater than 62 A, the processing unit 31 determines that the current flowing through the switchboard 200 is in an overload state and sends a third control signal to the display unit 32 to control the maximum current value to be displayed with a third color.

In this embodiment, the maximum value of the second preset range value may be, but is not limited to, 85% of the maximum current value that can flow through the switchboard 200.

In this embodiment, the display unit 32 may display the three-phase current information of the plurality of switchboards 200 at the same time. In this way, the three-phase current information of the plurality of switchboards 200 can be directly monitored through the display unit 32, so as to enable quick observation as to whether the current of a corresponding switchboard 200 is overloaded.

For example, when the maximum current value displayed by the display unit 32 displays a third color, it is determined that the current flowing through the switchboard 200 is overloaded, and step S35 is executed. When the maximum current value displayed by the display unit 32 displays the first color or the second color, it is determined that the current flowing through the switchboard 200 is not overloaded, and the process returns to block S32, that is, the processing unit 31 receives the current signal again and analyzes and filters out the three-phase current information.

At block S35, the notification unit 33 sends the received three-phase current information to relevant personnel to notify the same that the switchboard 200 is overloaded. Then, some circuit breakers 201 in the overloaded switchboard 200 can be powered off.

In this embodiment, when the current flowing through the switchboard 200 is determined to be overloaded, the position of the overloaded switchboard 200 is determined according to the identity number of the switchboard 200, and at least one of all circuit breakers 201 in the overloaded switchboard 200 can be powered off to reduce the current flowing through the switchboard 200, and avoid the possibility of excess heat or damage to the switchboard 200, and avoiding any effect on the normal operation of other servers 400.

Then, the current flowing through the switchboard 200 is re-monitored within a preset time, that is, it returns to block S31.

By monitoring the three-phase current information displayed by the electronic device 30, the amount of current flowing through the switchboard 200 can be monitored in actual or close to real-time without any direct monitoring in the equipment room, which saves labor costs and avoids shutdown of the switchboard 200 or being tripped due to untimely monitoring. Additionally, determining whether the current flowing through the switchboard 200 is overloaded according to this disclosure is intuitive and convenient to use.

It is believed that the embodiments and their advantages will be understood from the foregoing description, and it will be apparent that various changes may be made thereto without departing from the scope of the disclosure or sacrificing all of its advantages, the examples hereinbefore described merely being illustrative embodiments of the disclosure.

What is claimed is:

1. A system for monitoring a current flowing through each of a plurality of switchboards, the system comprising:
   a plurality of monitoring units, each of the plurality of monitoring units positioned in a switchboard for monitoring the current flowing through the switchboard and outputting a current signal;
   an electronic device, the electronic device electronically connected to the plurality of monitoring units; the electronic device comprising a processing unit and a display unit, the display unit electrically connected to the processing unit;
   a receiver, the receiver electrically connected to the plurality of switchboards and the processing unit;
   wherein the processing unit receives the current signal transmitted by the plurality of monitoring units, performs analysis and filter to output three-phase current information of the plurality of switchboards to the display unit for displaying;
   wherein the three-phase current information at least comprises three-phase current values, the display unit further displays a maximum current value of the three-phase current values to determine whether the three-phase current value is overloaded; and wherein when the maximum current value of the three-phase current value is within a first preset range, the processing unit determines that the current flowing through the switchboard is within a normal range and sends a first control signal to the display unit to control the maximum current value to be displayed with a first color.

2. The system of claim 1, wherein the receiver transmits the current signal output by the plurality of monitoring units to the electronic device.

3. The system of claim 2, wherein the processing unit receives the current signal transmitted by the receiver.

4. The system of claim 3 wherein when the maximum current value of the three-phase current value is within a second preset range, the processing unit determines that the current flowing through the switchboard is within a near overload range and sends a second control signal to the display unit to control the maximum current value to be displayed with a second color; and when the maximum current value of the three-phase current value is greater than the maximum value of the second preset range, the processing unit determines that the current flowing through the switchboard is in an overload state and sends a third control signal to the display unit to control the maximum current value to be displayed with a third color.

5. The system of claim 4, further comprising a notification unit, wherein the notification unit is electrically connected to the processing unit, when the processing unit determines that the maximum current value of the switchboard is greater than the maximum value of the second preset range, the notification unit receives a notification signal and the three-phase current information of the overloaded switchboard output by the processing unit.

6. The system of claim 3, wherein the three-phase current information further comprises the number of the switchboards, when the three-phase current value displayed by the display unit is overloaded, a position of the overloaded switchboard is determined according to the number of the switchboard.

7. A method for monitoring current comprising:

monitoring a current flowing through a switchboard and outputting a current signal;

receiving the current signal, performing analysis and filtering out three-phase current information; and displaying the three-phase current information;

wherein the three-phase current information at least comprises three-phase current values, a maximum current value of the three-phase current values is displayed to determine whether the three-phase current value is overloaded; and wherein when the maximum current value of the three-phase current value is within a first preset range, the current flowing through the switchboard is determined to be within a normal range and sends a first control signal to control the maximum current value to be displayed with a first color.

8. The method of claims, further comprising:

determining whether the current flowing through the switchboard is overloaded according to the three-phase current information; and sending the received three-phase current information to relevant personnel to notify that the switchboard is overloaded.

9. The method of claim 8, wherein when the maximum current value of the three-phase current value is within a second preset range, the current flowing through the switchboard is determined to be within a near overload range and sends a second control signal to control the maximum current value to be displayed with a second color.

10. The method of claim 8, wherein when the maximum current value of the three-phase current value is greater than the maximum value of the second preset range, the current flowing through the switchboard is determined to be in an overload state and sends a third control signal to control the maximum current value to be displayed with a third color.

11. The method of claim 8, wherein the three-phase current information further comprises the number of the switchboards, when the three-phase current value displayed is overloaded, a position of the overloaded switchboard is determined according to the number of the switchboard.

* * * * *